(12) United States Patent
Mueller et al.

(10) Patent No.: US 7,507,907 B2
(45) Date of Patent: Mar. 24, 2009

(54) CABLE FEED-THROUGH

(75) Inventors: Daniel Mueller, Remseck (DE); Peter Runze, Stuttgart (DE)

(73) Assignee: Lapp Engineering & Co., Zug (CH)

( * ) Notice: Subject to any disclaimer, the term of this patent is extended or adjusted under 35 U.S.C. 154(b) by 202 days.

(21) Appl. No.: 11/526,091

(22) Filed: Sep. 22, 2006

(65) Prior Publication Data
US 2008/0073102 A1    Mar. 27, 2008

(51) Int. Cl.
*H02G 15/02* (2006.01)
(52) U.S. Cl. ........................... 174/74 R; 174/78
(58) Field of Classification Search ............... 174/84 R, 174/74 R, 78, 88 C
See application file for complete search history.

(56) References Cited

U.S. PATENT DOCUMENTS

| 3,227,803 | A | * | 1/1966 | Gohs | 174/78 |
| 3,448,430 | A | * | 6/1969 | Kelly | 439/610 |
| 3,744,007 | A | * | 7/1973 | Horak | 439/394 |
| 4,022,966 | A | * | 5/1977 | Gajajiva | 174/653 |
| 4,308,417 | A | | 12/1981 | Martin | |
| 4,515,991 | A | | 5/1985 | Hutchison | |
| 4,739,126 | A | * | 4/1988 | Gutter et al. | 174/78 |
| 4,885,429 | A | * | 12/1989 | Schnittker | 174/668 |
| 5,059,747 | A | * | 10/1991 | Bawa et al. | 174/655 |
| 5,321,205 | A | * | 6/1994 | Bawa et al. | 174/655 |
| 5,432,301 | A | * | 7/1995 | Gehring | 174/78 |
| 5,763,833 | A | * | 6/1998 | Bawa et al. | 174/655 |
| 5,942,730 | A | * | 8/1999 | Schwarz et al. | 174/84 R |
| 5,951,327 | A | * | 9/1999 | Marik | 439/610 |
| 6,537,104 | B1 | | 3/2003 | Hagmann et al. | |
| 7,309,835 | B2 | * | 12/2007 | Morrison et al. | 174/74 R |

FOREIGN PATENT DOCUMENTS

| DE | 30 22 154 | 1/1981 |
| DE | 42 21 479 | 1/1994 |
| DE | 196 15 602 | 10/1997 |
| DE | 198 49 227 | 4/2000 |
| GB | 2 233 838 | 1/1991 |

* cited by examiner

*Primary Examiner*—William H Mayo, III
(74) *Attorney, Agent, or Firm*—Lipsitz & McAllister, LLC (57) ABSTRACT

A cable feed-through is provided in accordance with the present invention. The cable feed-through comprises a housing which can be fixed to an appliance, a fixing device for a cable held on the housing and a shield contact element held on the housing. The shield contact element comprises a bristle element for making contact with a cable shield with elastic and electrically conductive bristles.

33 Claims, 6 Drawing Sheets

CABLE FEED-THROUGH

BACKGROUND OF THE INVENTION

The invention relates to a cable feed-through, comprising a housing which can be fixed to an appliance, a fixing device for a cable held on the housing and a shield contact element held on the housing.

Cable feed-throughs of this type are known from the state of the art. The problem with them is that, on the one hand, the quality of the electrical contact between the shield contact element and a cable shield is always problematic, in particular, when the cable moves.

The object underlying the invention is, therefore, to improve a cable feed-through of the type described at the outset in such a manner that it is possible to make contact with the cable shield in as optimum a manner as possible.

SUMMARY OF THE INVENTION

This object is accomplished in accordance with the invention, for a cable feed-through of the type described at the outset, in that the shield contact element comprises a bristle element making contact with a cable shield with elastic and electrically conductive bristles.

The advantage of the solution according to the invention is to be seen in the fact that a simple possibility exists, as a result of contact being made with the cable shield by bristles, of providing a good connection between the cable shield and the shield contact element on account of the multiple contact between the bristle element and the cable shield.

Furthermore, the use of elastic and electrically conductive bristles has the great advantage that even a movement of the cable relative to the shield contact element is not a problem since the plurality of bristles can follow such a movement and maintain the electrical connection between the cable shield and the shield contact element without any problem.

In this respect, it has proven to be particularly advantageous when the bristle element can be inserted into the housing via an outer opening of the housing and can be secured in the housing.

The bristle element may be insertable into the housing in the most varied of ways. One possibility provides for the bristle element to be loosely insertable into the housing.

As a result, it is possible, for example, during detachment of the cable, to detach this together with the bristle element and withdraw the cable out of the cable feed-through, wherein the bristle element can then be removed from it via the outer opening.

The bristle element can preferably abut on a support provided on the housing.

In this respect, it is particularly favorable when the support has a contact surface on the housing side facing the outer opening.

This solution has the advantage that, with it, it is possible in a simple manner to provide and maintain an electrical contact between the bristle element and the electrically conductive housing via the support on the housing side and so the bristle element is in electrically conducting contact with the support.

Alternatively thereto, it is conceivable to design the bristle element such that this is in electrically conducting contact with an inner surface of the housing.

Such an electrically conducting contact between the housing and the bristle element may be realized technically in a particularly simple manner when the bristle element abuts on the inner surface of the housing by means of an element spreading outwards as a result of elastic tensioning.

Such an outwardly spreading element is produced, for example, from an elastic material.

Projections or lugs on the bristle elements could, for example, be such an element spreading outwards as a result of elastic tensioning.

No further details have likewise been given with respect to the securing of the bristle element on the housing. One advantageous embodiment provides, for example, for the bristle element to be fixed in the housing in a force locking manner.

In this case, the fixing in position of the bristle element is, therefore, brought about merely via force locking.

Such a fixing in position may be realized, for example, in that the bristle element abuts on an inner surface of the housing in a force locking manner as a result of an element spreading elastically outwards.

In this case, as well, the outwardly spreading element can be a projection or a lug of the bristle element.

In order to be able to anchor the bristle element securely in the cable feed-through it is preferably suggested that the bristle element be arranged in the housing between the contact surface on the housing side and the fixing device so that it is possible to realize the fixing in position of the bristle element in a simple manner.

One favorable solution provides for the bristle element to be secured as a result of its position between the support on the housing side and the fixing device.

In order to be able to maintain the electrical contact between the bristle element of the contact surface on the housing side in a reliable manner, it is expediently provided for the fixing device to act on the bristle element with an elastic force in the direction of the contact surface on the housing side so that a reliable, electrically conducting connection between housing and bristle element can be provided.

Such a generation of an elastic force acting on the bristle element by the fixing device may be realized in a particularly simple manner when the fixing in position of the cable in the fixing device generates a force on the fixing device which acts on the bristle element in the direction of the contact surface on the housing side.

In the simplest case, such a fixing device is designed such that this comprises an insert which can be inserted into the housing and with which the cable can be fixed in position.

The force favorable for the fixing in position of the bristle element and the contact surface on the housing side may be generated in a simple manner with an insert of this type.

In this respect, the insert is expediently designed such that it has elastic areas which can be acted upon by a cap nut in order to be able to hold the cable securely by means of the fixing device.

In this respect, it is particularly expedient when the cap nut acts on the insert in the direction of the contact surface on the housing side.

Furthermore, it is expedient when the insert acts on the bristle element in the direction of the contact surface on the housing side.

With respect to the construction of the bristle element, no further details have been given in conjunction with the preceding description of the individual embodiments. One advantageous solution, for example, provides for the bristle element to have at least one circle of bristles extending at least partially around a central axis of a cable feed-through channel.

In this respect, it is favorable with respect to a good contact being made with the cable shield when the circle of bristles is designed to extend essentially around the central axis.

It is even more advantageous when the bristle element has two circles of bristles arranged so as to be offset relative to one another in the direction of the central axis.

Furthermore, the bristle element may be used in a particularly simple manner in the solution according to the invention when the bristle element has a bristle support, in which the bristles are securely anchored.

One advantageous possibility of realization is for the bristle support to be designed in a C shape or like a ring.

In this respect, it is particularly favorable when the bristle support is produced from an elastic material.

In this case, the bristle support may be produced in a particularly simple manner and inserted into the place provided for it.

It is particularly simple in the case of this solution to design the bristle support such that this forms the outwardly spreading element since such a form can be designed so as to spread radially outwards with a suitable choice of material for the bristle support consisting of an elastic material.

A particularly favorable embodiment of the bristle support provides for this to be designed as an annular member which is provided with a radial slot, can be pressed together radially with narrowing of the width of the slot and is then in a state, in which it has the tendency to spread radially outwards.

A secure anchoring of the bristles could be brought about, for example, in that the bristles are fixed to the bristle support by way of material locking.

It is particularly expedient when the bristles are anchored in the bristle support by means of a U-shaped bent portion which allows a secure fixing of the bristles in the bristle support.

Such a U-shaped bending of the bristles for the advantageous anchoring thereof may be utilized systematically to the extent that the bristles are designed as double bristles and that each bristle extends from a respective arm of the U-shaped bent portion.

As a result, a relatively large number of bristles may be realized in a simple manner and, on the other hand, these bristles are, however, anchored reliably in the bristle support.

The bristle support may be designed in the most varied of ways.

It has proven to be advantageous, in particular, for the anchoring of the bristles with the U-shaped bent portion when the bristle support has an inner member, around which the U-shaped bent portion engages.

In this respect, it is particularly favorable when the inner member is arranged in such a manner that the U-shaped bent portion engages around it on its side facing away from the central axis.

With such a solution with an inner member, the bristles can be anchored on the inner member, for example, in a material locking manner in addition.

For reasons of a simple producibility of the bristle support, an outer member is expediently provided which keeps the bristles in abutment on the inner member in the area of the U-shaped bent portion.

In this respect, the outer member is preferably formed onto the unit consisting of bristles and inner member as a result of deformation and, therefore, clamps the U-shaped bent portion to the inner member in order to fix the bristles securely between the inner member and the outer member.

With respect to the alignment of the bristles on the bristle support, no further details have so far been given.

One particularly favorable development provides for the bristles to extend transversely to the central axis of the cable feed-through channel in the state not making contact with the cable shield.

It is particularly expedient when the bristles extend approximately radially to the central axis in the state not making contact with the cable shield.

Expediently, it is favorable for a reliable contact to be made with the cable shield when the bristles extend from the bristle support as far as a central opening.

In this respect, the central opening is preferably selected such that the diameter is smaller than a diameter of a cable shield of a cable provided for such a cable feed-through.

In addition, no details have been given in conjunction with the preceding description of the solution according to the invention regarding the type of bristles.

In the simplest case, the bristles are produced from a strand material which is approximately round or oval in cross section.

It is, however, also conceivable for the bristles to be produced from a strand material having at least one flat side.

In this case, the bristles are then aligned such that the flat side abuts on the inner member of the bristle support.

No further details have as yet been given concerning a diameter of the bristles.

In order to be able to exploit the property of the bristles, namely their great flexibility, advantageously, it is preferably provided for the bristles to have a cross sectional surface area, the maximum diameter of which is smaller than 1 mm.

A particularly favorable solution provides for the bristles to have a diameter in the range of approximately 0.05 to approximately 0.1 mm.

With such diameters of the bristles, particularly favorable properties may be with respect to the quality of the contact made and the flexibility of the contact made with essentially the same quality.

Additional features and advantages of the invention are the subject matter of the following description as well as the drawings illustrating several embodiments.

DETAILED DESCRIPTION

Figure 1:
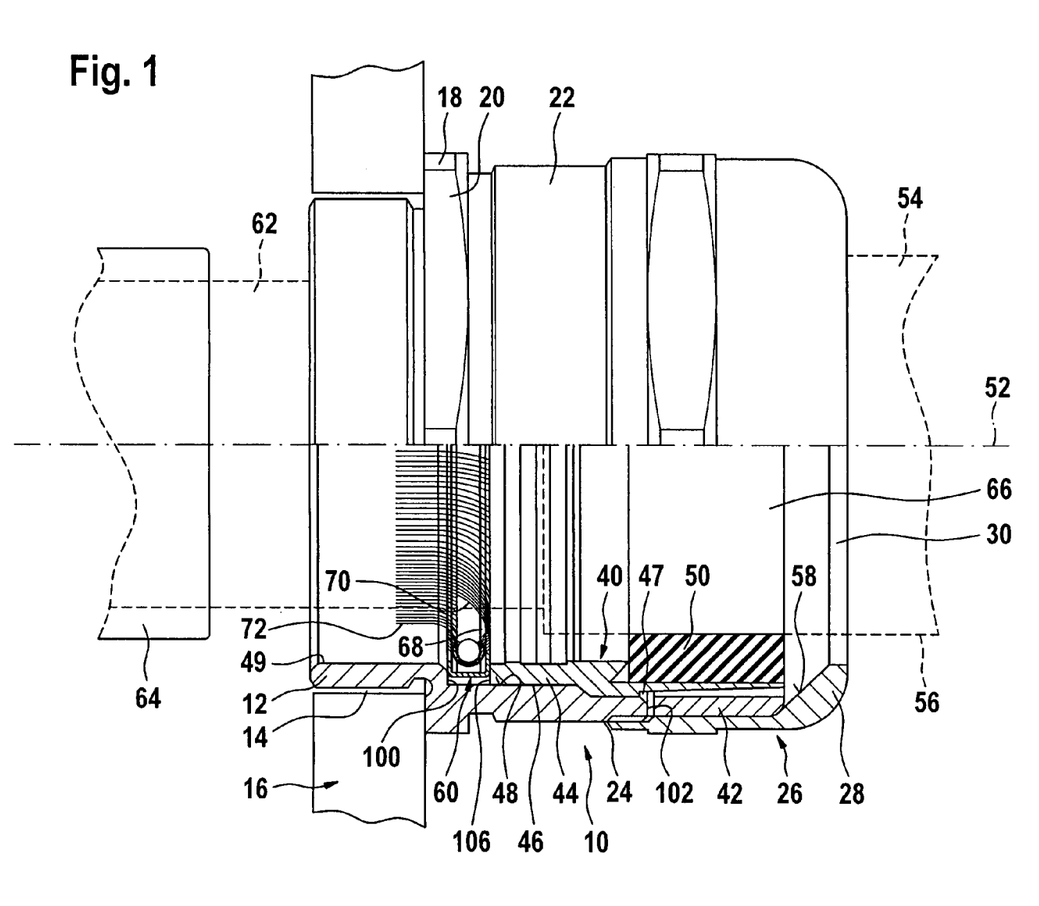
FIG. 1 shows a first embodiment of a cable feed-through according to the invention partially cut away in longitudinal direction.

One embodiment of a cable feed-through according to the invention, illustrated in FIG. 1, comprises a housing designed as a socket which can be screwed with a threaded section 12 into a recess 14 of a wall 16 of an appliance.

Furthermore, the housing 10 comprises a flange 18 adjoining the threaded section 12 and having an outer multiple-sided portion 20 which can abut on the wall 16 of the appliance when the threaded section 12 is screwed into the recess 14.

Following the flange 18, a tubular section 22 of the housing 10 extends on a side located opposite the threaded section 12 as far as a threaded section 24, which is arranged at an end of the tubular section 22 located opposite the flange 18 and onto which a cap nut, which is designated as a whole as 26 and provided with an opening 30 at its end side 28, can be screwed.

An insert designated as a whole as 40 is seated in the housing 10 and this insert is preferably designed as a plastic part and has a fin basket 42 which is arranged in the area of the cap nut 26 and is covered by the cap nut 26. The fin basket 42 is followed by a sleeve 44 which extends from an outer opening 47 of the housing 10 arranged at the end side of the threaded section 24 into the housing 10 in the direction of an inner opening 49, arranged at the end side of the threaded section 12, and is guided with its casing 46 on an inner surface 48 of the tubular section 22 of the housing 10.

Furthermore, a sealing ring 50 is arranged in the fin basket 42 and this ring can be acted upon by the fin basket 42 radially in the direction towards a central axis 52 of the housing 10 in order to act on a cable 54 penetrating the sealing ring 50 and fix it in position in a sealingly closed manner in the area of a cable sheath 56.

The fin basket 42 can be acted upon in the known way in the direction of the central axis 52 by a pressure surface 58 extending conically in relation to the central axis 52 in order to move the sealing ring 50 in the manner described.

The sealing ring 50, the insert 40 with the fin basket 42 and the cap nut 26 form, altogether, a fixing device for the cable 54.

Furthermore, a shield contact element for making contact with a cable shield 62, which is located beneath an outer insulation sleeve 64 of the cable 54, is seated in the housing 10.

In the case of a cable 54 guided through a feed-through channel 66, which extends through the opening 30 of the cap nut 26, through the cap nut 26, the sealing ring 50, the insert 40 and the housing 10 with the threaded section 12 and, therefore, completely through the threaded cable connection, the exposed cable shield 62, with which the shield contact element 60 can make contact, is preferably provided in an area located within the housing 10 following the sealing ring 50.

The shield contact element 60 comprises, for its part, a bristle support 68, from which a first circle of bristles 70 and a second circle of bristles 72 project, which extend in different surface areas starting from the bristle support 68 and exit from the bristle support 68 at a distance from one another when seen in the direction of the central axis 52.

Figure 2:
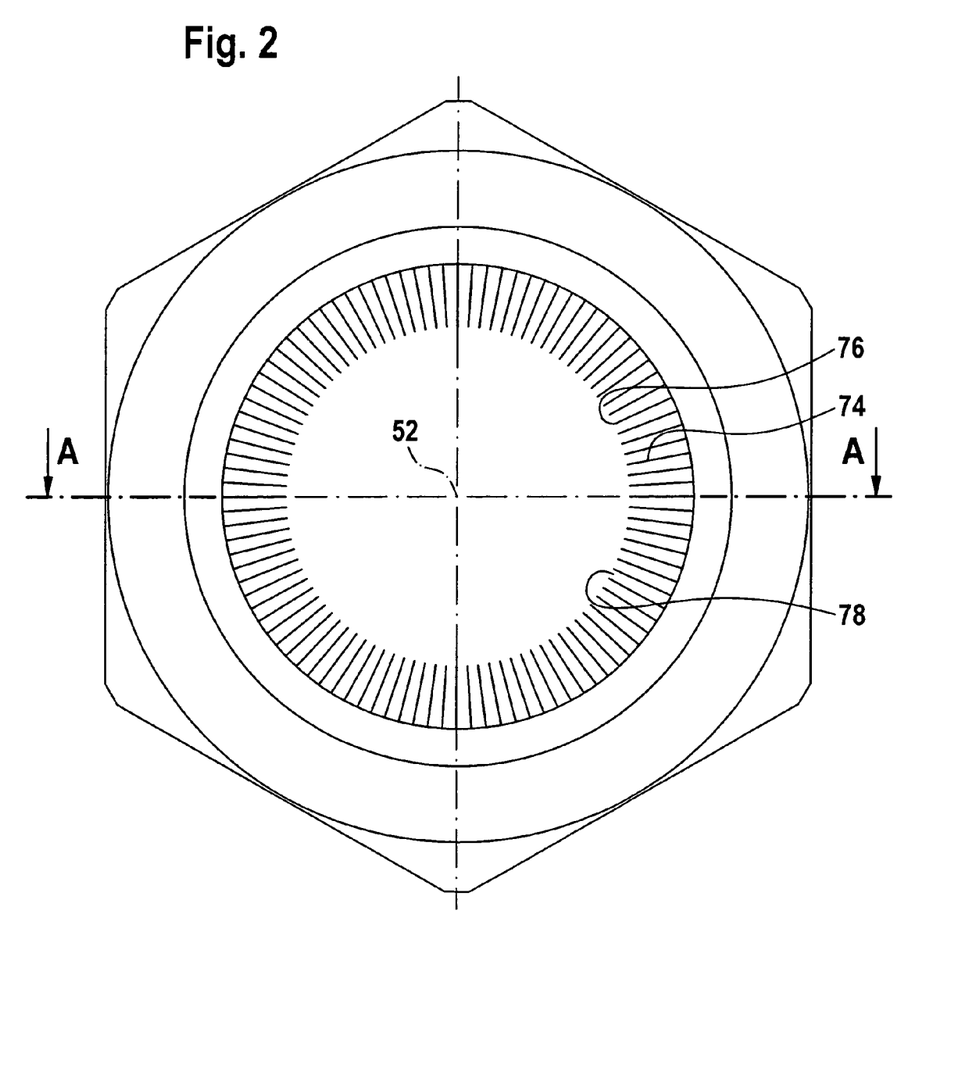
FIG. 2 shows a view in the direction of arrow A in FIG. 1.

As illustrated in FIGS. 1 and 2, the circles of bristles 70 and 72 have individual bristles 74 which are located next to one another, exit from the bristle support 68 first of all essentially in a radial direction and are bent over in the direction of the threaded section 12 when a cable 54 is pushed through the feed-through channel 66 and abut on the cable shield 62 at least with their end areas 76.

When a cable 54 is not pushed through the feed-through channel 66, the bristles 74, as illustrated in FIG. 2, extend from the bristle support 66 essentially approximately in a radial direction in relation to the central axis 53 and, with their end areas 76, form a central opening 78 of the shield contact element 60, the diameter of which is smaller than the diameter of the cable shield 62 of the cable provided for this cable feed-through.

As a result, the bristles 74 can be bent over with their end areas 76 in the direction of feed through and abut on the cable shield 62 as a result of the cable 54 simply being pushed through the cable feed-through channel 66 with an exposed cable shield 62 proceeding from the opening 30.

Figure 3:
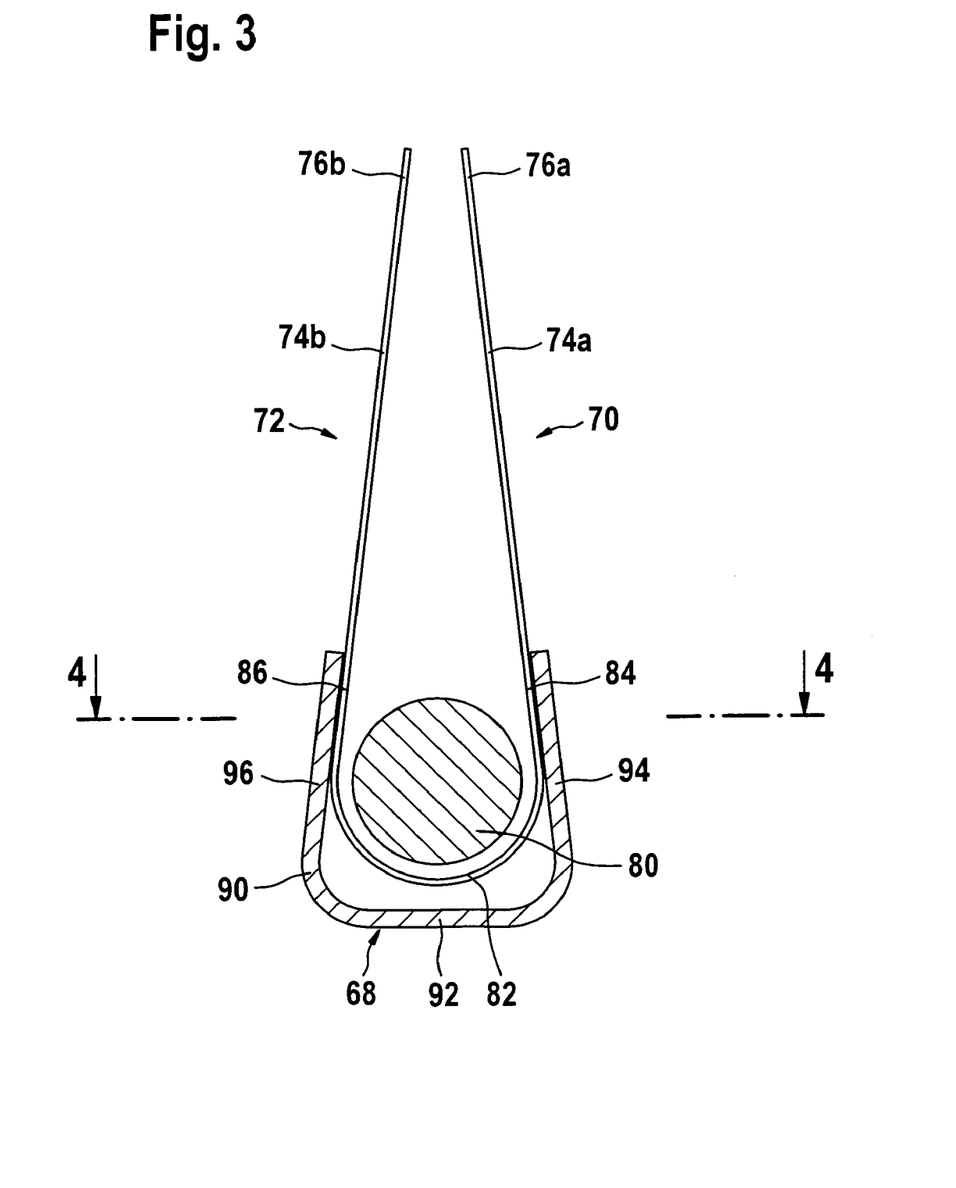
FIG. 3 shows an enlarged cross section through a first embodiment of a bristle element according to the invention.

As illustrated on an enlarged scale in FIG. 3, the bristle support 68 comprises a ring-shaped inner member 80 which has, for example, a circular cross section and a U-shaped bent portion 82 is placed around this inner member 80, the arms 84, 86 of this bent portion each continuing in a bristle, for example, in the bristles 74a and 74b, wherein the bristles 74a form the circle of bristles 70 and the bristles 74b the second circle of bristles 72 and wherein the end areas 76a, 76b of the bristles 74a, 74b are arranged on a side located opposite the bent portion 82.

The bristles 74a and 74b are preferably produced, together with the bent portion 82, from a one-piece, electrically conductive piece of wire or piece of flat material which is placed around the inner member 80 of the bristle support 68.

It is, however, also conceivable to configure the bent portion 82 from an electrically conductive strip of material which abuts on the inner member 80 on its circumferential side and from which the bristles 74a, b, which are integrally formed in one piece, then project and by means of which several bristles 74a, b are held together.

In order to fix the bristles 74a and 74b on the inner member 80 together with the bent portion 82, the bristle support 68 comprises, in addition, an outer member 90 which is designed as a piece of sheet material bent in a U shape in cross section which engages around the bristle support 80 with the bent portion 82 placed around it on the outer side with a central arm 92 and two side arms 94 and 96, wherein the side arms 94 and 96 abut on the arms 84, 86 of the bent portion 82 so that the inner member 80 with the bent portion 82 is fixed in the outer member 90 in a form locking manner and, therefore, the bristles 74a and 74b are also anchored securely in the bristle support 68.

In this respect, the outer member 90 is preferably formed from a metal sheet which is a good conductor, wherein the side arms 94 and 96 abut securely on the bent portion 82 with the arms 84 and 86 as a result of a deformation process.

As a result, the bristles 74a and 74b are anchored undetachably and securely in the bristle support 68 and so there is only very little chance of the bristles 74a and 74b being loosened from the bristle support 68.

In order to fix the bristle support 68 in the housing 10, this is provided, following the threaded section 12, with a shoulder 100 which faces the outer opening and represents a contact surface for the bristle support 68 which extends transversely to the central axis 52 and radially as far as the inner shell surface 48 of the housing 10.

Proceeding from the shoulder 100, the inner shell surface 48 does not extend so as to narrow but, where applicable, so as to slightly widen as far as an end side 102 of the housing 10 which is also bordered by the threaded section 24 so that the bristle support 68 can be freely introduced into the housing 10 via the outer opening 47 of the housing 10 defined by the end side 102 and can rest on the shoulder 100.

In order to fix the bristle support 68 in position, this is acted upon by an end side 106 of the sleeve 44 of the insert 40, wherein the entire insert 40 is always acted upon, as a result, in the direction of the shoulder 100 since the pressure surface 58 acts on the fin basket 42 when the cap nut 26 is screwed on but not only presses the basket radially inwards in the direction of the central axis 52 but, at the same time, acts on it in the direction of the shoulder 100.

As a result, the bristle support 68 is always kept in abutment on the shoulder 100 and, therefore, on the housing 10 due to pressure acting on it when the cap nut 26 acts on the fin basket 42.

If the housing 10 is designed to be electrically conducting and the bristle support 68 is provided at least with one electrically conductive outer member 90 which acts on the arms 84, 86 of the U-shaped bent portion 82, an electrically conducting connection between the electrically conductive bristles 74a and 74b of the circles of bristles 70 and 72, respectively, and the housing 10 can be provided via the outer member 90.

As a result, the cable shield 62 may also be connected to the housing wall 16 in an electrically conducting manner via an electrically conducting connection of the outer member 10.

Figure 4:
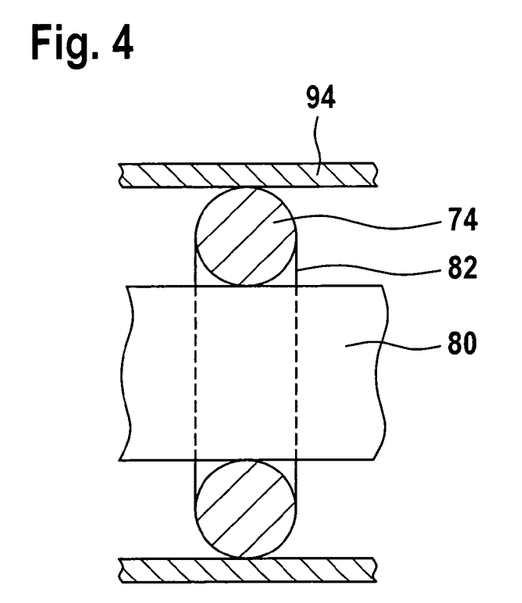
FIG. 4 shows a section along line 4-4 in FIG. 3.

As illustrated in FIG. 4, the bristles 74a and 74b together with the bent portion 82 are preferably produced from a material which is elastic, round in cross section and electrically conductive, such as, for example, copper.

Figure 5:
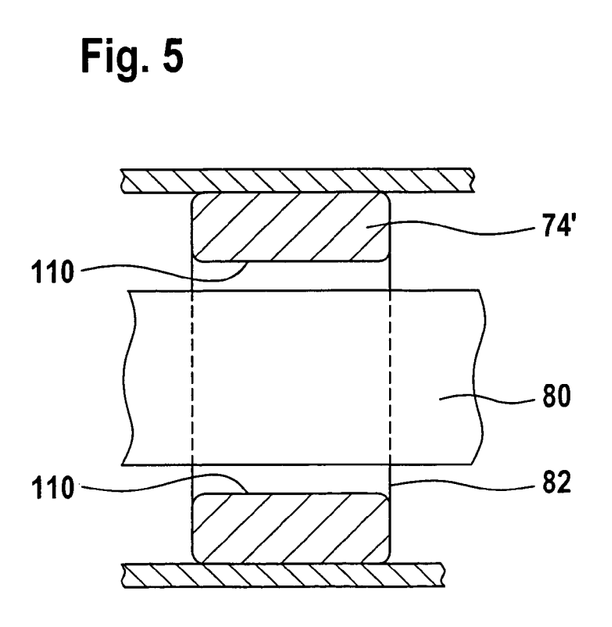
FIG. 5 shows a section similar to FIG. 4 through a second embodiment of a cable feed-through according to the invention.

It is, however, also conceivable, as illustrated in FIG. 5, to produce the bristles 74' as well as the bent portion 82' from an elastic and electrically conductive strip of material which is, however, rectangular in cross section, is placed around the inner member 80 and preferably abuts with a flat side 110 on the inner member 80.

Figure 6:
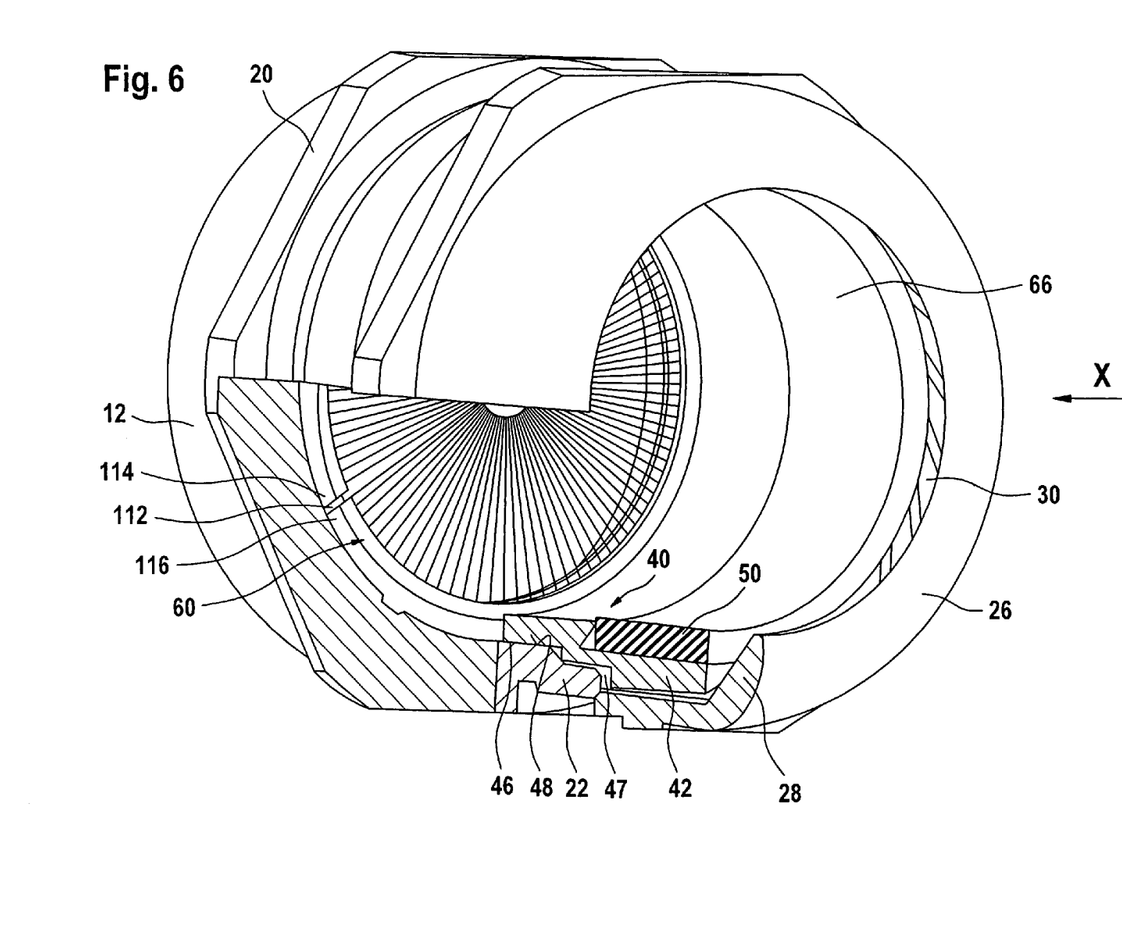
FIG. 6 shows a perspective illustration, partially cut away, of a third embodiment of a cable feed-through according to the invention.
Figure 7:
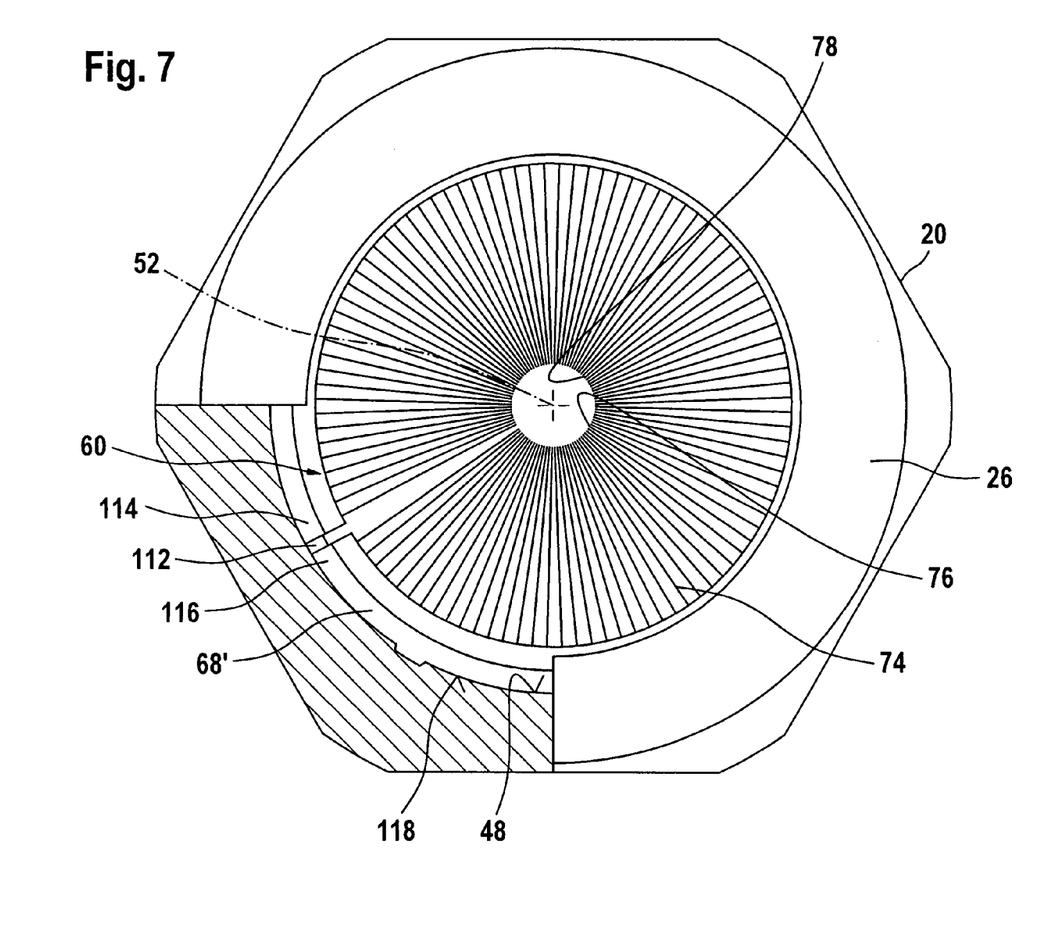
FIG. 7 shows a plan view of the cable feed-through according to the third embodiment in the direction of arrow X in FIG. 6.

In a third embodiment of a cable feed-through according to the invention, illustrated in FIGS. 6 and 7, those elements which are identical to the first embodiment are given the same reference numerals and so reference can be made in full to the remarks concerning the first embodiment with respect to their explanation.

In contrast to the first embodiment, the bristle support 68' is deigned as an almost complete ring with a radial slot 112 which is tensioned such that ends 114 and 116 of the bristle support 68' bordering on the slot 112 have the tendency to move away from one another and, therefore, to widen an outer circumferential surface 118 formed by the central arm 92 radially with respect to the central axis 52, at least in sections.

As a result, the outer circumferential surface 118 abuts with tension against the inner surface 48 of the sleeve 44 and so the bristle support 68' is secured, on the one hand, on the inner surface 48 due to friction locking and, on the other hand, provides a good, electrically conducting contact between the bristle support 68' and the sleeve 44 on account of the tensioned abutment of the outer circumferential surface 118 on the inner surface 48.

A secure fixing of the bristle support 68' in the sleeve 44 is therefore ensured without it being absolutely necessary to act on the bristle support 68' in the direction of the shoulder 100 by means of the insert 40.

What is claimed is:

1. Cable feed-through, comprising:
a housing fixable to an appliance,
a fixing device for a cable held on the housing, and
a shield contact element held on the housing,
the shield contact element comprising a bristle element having a circle of a plurality of bristles making contact with a cable shield with elastic and electrically conductive bristles by forming a bristle curtain between the cable and the housing.

2. Cable feed-through as defined in claim 1, wherein the bristle element is insertable into the housing via an outer opening of the housing and securable in the housing.

3. Cable feed-through as defined in claim 2, wherein the bristle element is adapted to abut on a support provided on the housing.

4. Cable feed-through as defined in claim 3, wherein the bristle element is in electrically conducting contact with the support.

5. Cable feed-through as defined in claim 3, wherein the bristle element is arranged in the housing between the support on a housing side and the fixing device.

6. Cable feed-through as defined in claim 5, wherein the bristle element is secured as a result of its position between the support on the housing side and the fixing device.

7. Cable feed-through as defined in claim 6, wherein the fixing device acts on the bristle element with an elastic force in a direction of a contact surface on a housing side.

8. Cable feed-through as defined in claim 7, wherein a fixing in position of the cable in the fixing device generates a force on the fixing device acting on the bristle element in a direction of a contact surface on a housing side.

9. Cable feed-through as defined in claim 2, wherein the support has a contact surface on a housing side facing the outer opening.

10. Cable feed-through as defined in claim 1, wherein the bristle element is in electrically conducting contact with an inner surface of the housing.

11. Cable feed-through as defined in claim 10, wherein the bristle element abuts on the inner surface of the housing by means of an element spreading outwards as a result of elastic tensioning.

12. Cable feed-through as defined in claim 1, wherein the bristle element is fixed in the housing in a force locking manner.

13. Cable feed-through as defined in claim 12, wherein the bristle element abuts on an inner surface of the housing in a force locking manner as a result of an element spreading elastically outwards.

14. Cable feed-through as defined in claim 1, wherein the fixing device comprises an insert insertable into the housing, the cable being fixable in said insert.

15. Cable feed-through as defined in claim 14, wherein the insert has elastic areas adapted to be acted upon by a cap nut.

16. Cable feed-through as defined in claim 15, wherein the cap nut acts on the insert in a direction of a contact surface on a housing side.

17. Cable feed-through as defined in claim 16, wherein the insert acts on the bristle element in the direction of the contact surface on the housing side.

18. Cable feed-through as defined in claim 1, wherein the bristle element has at least one circle of bristles extending at least partially around a central axis of a cable feed-through channel.

19. Cable feed-through as defined in claim 18, wherein the bristle element has two circles of bristles arranged so as to be offset relative to one another in the direction of the central axis.

20. Cable feed-through as defined in claim 1, wherein the bristles extend transversely to a central axis of the cable feed-through channel in a state not making contact with the cable shield.

21. Cable feed-through as defined in claim 1, wherein the bristles extend approximately radially to a central axis in a state not making contact with the cable shield.

22. Cable feed-through as defined in claim 1, wherein the bristles extend from the bristle support as far as a central opening.

23. Cable feed-through as defined in claim 1, wherein the bristles have an approximately round or oval cross section.

24. Cable feed-through as defined in claim 1, wherein the bristles have a cross section with a flat side.

25. Cable feed-through as defined in claim 1, wherein the bristles have a cross sectional surface area with a maximum diameter smaller than 1 mm.

26. Cable feed-through, comprising:
a housing fixable to an appliance,
a fixing device for a cable held on the housing, and
a shield contact element held on the housing,
the shield contact element comprising a bristle element making contact with a cable shield with elastic and electrically conductive bristles,
the bristle element having a bristle support designed in a C shape or like a ring, the bristles being anchored in said support by means of a U-shaped bent portion,
the bristles being designed as double bristles, each bristle extending from a respective arm of the U-shaped bent portion.

27. Cable feed-through as defined in claim 26, wherein the bristle support forms an outwardly spreading element.

28. Cable feed-through as defined in claim 26, wherein the bristle support has an inner member, the U-shaped bent portion engaging around said inner member.

29. Cable feed-through as defined in claim 28, wherein the U-shaped bent portion engages around the inner member from a side facing away from a central axis.

30. Cable feed-through comprising:
a housing fixable to an appliance,
a fixing device for a cable held on the housing, and
a shield contact element held on the housing,
the shield contact element comprising a bristle element making contact with a cable shield with elastic and electrically conductive bristles,
the bristle element having a bristle support,
the bristle support being designed as an annular member provided with a radial slot and forming an outwardly spreading element, and the bristles being anchored in the bristle support by means of a U-shaped bent portion.

31. Cable feed-through as defined in claim 30, wherein the bristles are designed as double bristles and each bristle extends from a respective arm of the U-shaped bent portion.

32. Cable feed-through comprising:
a housing fixable to an appliance,
a fixing device for a cable held on the housing, and
a shield contact element held on the housing,
the shield contact element comprising a bristle element making contact with a cable shield with elastic and electrically conductive bristles,
the bristle element having a bristle support,
the bristles being anchored in the bristle support by means of a U-shaped bent portion engaging around an inner member, and
the bristle support having an outer member keeping the bristles in abutment on the inner member in an area of the U-shaped bent portion.

33. Cable feed-through as defined in claim 32, wherein the outer member is formed onto a unit consisting of the bristles and the inner member as a result of deformation.

* * * * *